(12) United States Patent
Tsukagoshi et al.

(10) Patent No.: US 8,946,664 B2
(45) Date of Patent: Feb. 3, 2015

(54) OPTICAL SENSOR DEVICE HAVING WIRING PATTERN WITHIN CAVITY HOUSING OPTICAL SENSOR ELEMENT

(75) Inventors: Koji Tsukagoshi, Chiba (JP); Hitoshi Kamamori, Chiba (JP); Sadao Oku, Chiba (JP); Hiroyuki Fujita, Chiba (JP); Keiichiro Hayashi, Chiba (JP)

(73) Assignee: Seiko Instruments Inc. (JP)

( * ) Notice: Subject to any disclaimer, the term of this patent is extended or adjusted under 35 U.S.C. 154(b) by 284 days.

(21) Appl. No.: 13/471,602

(22) Filed: May 15, 2012

(65) Prior Publication Data

US 2013/0001409 A1    Jan. 3, 2013

(30) Foreign Application Priority Data

Jun. 30, 2011   (JP) .................... 2011-145893

(51) Int. Cl.
    *G02B 27/00*    (2006.01)
    *H01L 31/0203*    (2014.01)
    *H01L 31/0216*    (2014.01)

(52) U.S. Cl.
    CPC ...... *H01L 31/0203* (2013.01); *H01L 31/02162* (2013.01)
    USPC .......................................... 250/551; 250/239

(58) Field of Classification Search
    USPC ............... 250/551, 239, 208.1; 257/432–436, 257/80–85; 438/106–113
    See application file for complete search history.

(56) References Cited

U.S. PATENT DOCUMENTS 8,659,105 B2 *   2/2014   Takeshita et al. ............. 257/432

* cited by examiner

*Primary Examiner* — Que T Le
(74) *Attorney, Agent, or Firm* — Adams & Wilks

(57) ABSTRACT

A low-cost, compact, high-reliability optical sensor device has an optical sensor element mounted in a package comprised of a light shielding glass lid substrate, a part of which has a light filter function, adhered to a light shielding glass substrate having a cavity. In a through hole in the light shielding glass lid substrate, glass having a function of absorbing infrared light and transmitting visible light by its own property is embedded. The light shielding glass substrate is made of glass having light shielding property as its own property.

20 Claims, 3 Drawing Sheets

OPTICAL SENSOR DEVICE HAVING WIRING PATTERN WITHIN CAVITY HOUSING OPTICAL SENSOR ELEMENT

BACKGROUND OF THE INVENTION

1. Field of the Invention

The present invention relates to an optical sensor device in which an optical sensor element is mounted on a package material using a glass substrate.

2. Description of the Related Art

In recent years, mobile terminals such as mobile personal computers, tablet personal computers, and smartphones are rapidly becoming widespread. This is because those mobile terminals have a large number of functions and another main reason is that they are designed to promote portability such as light in weight and thin in thickness. On the other hand, the number of electronic parts used in mobile terminals is numerous along with the pursuit of multi-functionality and portability, and further reduction in size, thickness, and cost and power saving are now always required. As a result, a resin mold package has been widely adopted for electronic parts. Behind the trend is common use of parts and materials. An optical sensor, which is one of mounting electronic parts responsible for reducing power consumption, is not exceptional. Similarly to other electronic parts, a resin mold package is often used to reduce the size, thickness, and cost.

FIG. 2 of Japanese Patent Application Laid-open No. 2007-36264 is a cross-sectional view of an illuminance sensor package in which a light receiving element is mounted on an insulating substrate made of a resin material and is molded by a resin. An electrode 4 is formed on the front surface of a resin substrate 1. The electrode 4 is wired so as to surround the rear surface of the substrate, thereby being connectable to the outside. The electrode 4 has an optical sensor element 2 mounted thereon. A top surface 2a of the optical sensor element 2 and the electrode 4 are electrically connected via a wire 6. The optical sensor element 2 is firmly fixed onto the electrode 4 by a conductive paste 5. The conductive paste 5 electrically connects the light receiving element 2 and the electrode 4 to each other. An electromotive force generated by light entering the top surface 2a of the optical sensor element 2 can be allowed to flow from the conductive paste 5 to the electrode 4 to be transferred to the outside.

In FIG. 2 of Japanese Patent Application Laid-open No. 2007-36264, the optical sensor element 2 is molded by a resin 11 as a whole. The resin 11 is made of a translucent resin, and an epoxy resin or the like is used. An infrared absorbing film 12 is provided on the resin 11. The infrared absorbing film 12 uses a resin and has a structure in which a liquid resin or a film is adhered and laminated on the resin 11. As the liquid resin, an epoxy resin or the like is used. In the case of using a film, a film is adhered on the resin 11 via a resin adhesive. With this, the optical sensor element 2 can receive visible light from which infrared light has been filtered, thereby serving as an optical sensor corresponding to the visibility. Such infrared absorbing effect can also be obtained even when an infrared absorbing substance used for the infrared absorbing film 12 is dispersed and mixed in the translucent resin 11.

However, the optical sensor device described in Japanese Patent Application Laid-open No. 2007-36264 has a package structure in which an epoxy resin or the like is used for sealing the element, and hence has a problem such as weak in environmental reliability including heat resistance and moisture resistance of the material. In particular, a resin or a film forming the infrared absorbing film is thin and weak against heat and moisture. Further, the infrared absorbing film needs to be adhered after the molding of an epoxy resin used for sealing the element and the curing of the epoxy resin. If a liquid resin or a film having the infrared absorbing function is repeatedly adhered on the cured resin, the adhesiveness of an adhesive layer is weakened. Accordingly, under an environment in which heat or moisture is added or an environment in which expansion and contraction are repeated with a temperature cycle repeating high temperature and low temperature as exemplified by a reliability test, the infrared absorbing film may consequently peel off easily.

Further, in the optical sensor device described in Japanese Patent Application Laid-open No. 2007-36264, as the infrared absorbing film for obtaining intended characteristics, a resin such as an epoxy resin is used as an example. In the case of using an epoxy resin or the like as the infrared absorbing film, the resin may be dissolved by moisture or heat. As a result, there is a problem that the infrared light as an absorption target cannot be absorbed and desired characteristics cannot be obtained progressively.

Further, in the optical sensor device described in Japanese Patent Application Laid-open No. 2007-36264, the element is molded by the transparent resin and the infrared absorbing film is provided only on the top surface of the optical sensor element. Accordingly, infrared light cannot be absorbed for light entering the optical sensor element from the side surface of the molding transparent resin or from an obliquely upward direction. As a result, there is a problem that light from which infrared light has not been absorbed also enters the optical sensor element, and desired characteristics cannot be obtained.

In light of the foregoing, some of electronic components which use glass as a package material have been commercially available. The glass material prevents moisture and contaminants from entering from outside and is also high in airtightness. The glass material has a coefficient of thermal expansion approximate to that of a silicon substrate forming a semiconductor element, and hence, when the semiconductor element is mounted on a glass package, the reliability of a mounting surface or a bonding surface can be enhanced. In addition, the glass material is inexpensive, and hence the increase in manufacturing cost can be suppressed.

FIG. 1 of Japanese Patent Application Laid-open No. Sho 61-214565 is a cross-sectional view of an illuminance sensor package in which an optical sensor element is mounted on a substrate made of a ceramic material and is hermetically sealed by an insulating frame and a transparent glass plate. On the front and rear surfaces of a ceramic substrate 11, wiring patterns 12 and 19 are provided by metallization, respectively, and are electrically connected to each other via a through electrode 18. An optical sensor element 13 is mounted on the substrate 11, and the top surface of the optical sensor element 13 and the wiring pattern 12 provided on the front surface of the substrate are electrically connected to each other via a wire 14. On the substrate, an insulating frame 15 is provided so as to surround the optical sensor element 13 and outside the portion at which the wire 14 is connected to the wiring pattern 12 from the top surface of the optical sensor element 13. The insulating frame 15 and the front surface of the substrate are adhered by a resin or the like. Transparent glass 17 is further adhered on the upper end of the insulating frame 15 by low-melting-point glass or the like.

The optical sensor element 13 is in a hollow state surrounded by the insulating frame 15 and the transparent glass 17. This is a structure in which the element and the wire are free from stress and protected, which is often a problem to be solved in a structure sealed by a resin mold. External light enters the top surface of the optical sensor element 13 through the transparent glass 17 to generate an electro motive force. The electro motive force generated by the optical sensor element 13 is transferred from the wire 14 through the wiring pattern 12 and the through electrode 18 to a wiring pattern 19 provided on the rear surface side of the substrate 11. The substrate 11 is not a multilayer but a single layer of the ceramic material, and, as the substrate material, a glass epoxy resin or the like is used as well as ceramic. Thus, the cost of the package is reduced.

The optical sensor device described in Japanese Patent Application Laid-open No. Sho 61-214565 does not use a resin which is used in the above-mentioned optical sensor device described in Japanese Patent Application Laid-open No. 2007-36264, but mainly uses a high-reliability material such as ceramic and glass. This can eliminate a weak portion, which is a problem inherent in the resin material. However, the optical sensor device described in Japanese Patent Application Laid-open No. Sho 61-214565 needs to be assembled with the use of different materials and parts such as the substrate, the insulating frame, and the transparent glass, and hence it is difficult to reduce the cost of the package. Further, the materials of the main components of the package, including the substrate, the insulating frame, and the transparent glass, have significantly different coefficients of expansion. Accordingly, under a temperature cycle test environment repeating high temperature and low temperature, the package is susceptible to damage due to stress generated by the difference in coefficient of expansion. In addition, the manufacturing of the package involves work of applying or printing low-melting-point glass or a resin and work of melting the low-melting-point glass or curing the resin. This results in problems that the reliability is partially low, the manufacturing process is long and complicated, and the manufacturing cost is difficult to reduce.

In the optical sensor device described in Japanese Patent Application Laid-open No. Sho 61-214565, the optical sensor element is surrounded by the insulating frame, and hence it is possible to remove light entering the element from the side surface and from an obliquely upward direction, which is a problem in the above-mentioned optical sensor device described in Japanese Patent Application Laid-open No. 2007-36264. However, the insulating frame is attached onto the substrate by adhesion in a later stage, and hence, as is understood from FIG. 1 of Japanese Patent Application Laid-open No. Sho 61-214565, the substrate needs to be designed to have larger dimensions than those of the insulating frame. Thus, there is a problem that the overall package size is difficult to reduce.

SUMMARY OF THE INVENTION

It is therefore an object of the present invention to provide a compact, low-cost, high-reliability optical sensor device capable of removing light entering from the side surface and from an obliquely upward direction with a small number of parts.

An optical sensor device of the present invention includes: a light shielding glass substrate having a filter function in part; a light shielding glass substrate including a cavity; and an optical sensor element mounted on any one of the substrates. The glass substrate including the cavity has a light shielding function. Wiring patterns are provided by metallization on a front surface of the glass substrate having the filter function and a front surface of the glass substrate including the cavity. A wiring pattern is provided by metallization on a rear surface of the any one of the substrates on which the optical sensor element is mounted. This wiring pattern is electrically connected to the wiring patterns provided on the front surface via a through electrode. The glass substrate having the filter function and the glass substrate including the cavity are one of bonded and adhered to each other, to thereby form an optical sensor device package.

Further, the light shielding glass substrate having the filter function is a glass substrate including glass having a filter function in part.

Further, the glass having the filter function is embedded in the light shielding glass substrate.

Further, the glass having the filter function is glass having a function of filtering out a specific wavelength by its own property.

Further, the glass substrate having the filter function is a glass substrate in which an interference filter made of a metal oxide multilayer film is formed on transparent glass in part.

Further, the glass having the filter function has a frustum shape.

Further, the light shielding glass substrate is glass having light shielding property as its own property.

According to the optical sensor device of the present invention, the optical sensor element can be hermetically sealed by glass, and a high-reliability package can be obtained. Further, light entering the optical sensor element from a lateral direction or from an obliquely upward direction is shielded by the light shielding glass, and it is possible to receive only visible light from which infrared light has been removed, which passes through the glass having the filter function provided above a light receiving surface of the optical sensor element, and hence the optical sensor device can serve as an optical sensor corresponding to the visibility. In addition, the package has a structure in which the glass substrates are adhered to each other and which is made of only a glass material, and hence the difference in coefficient of expansion can be significantly reduced. Thus, an optical sensor device excellent in cost, characteristics, and reliability can be provided.

DETAILED DESCRIPTION OF THE PREFERRED EMBODIMENTS

Figure 1:
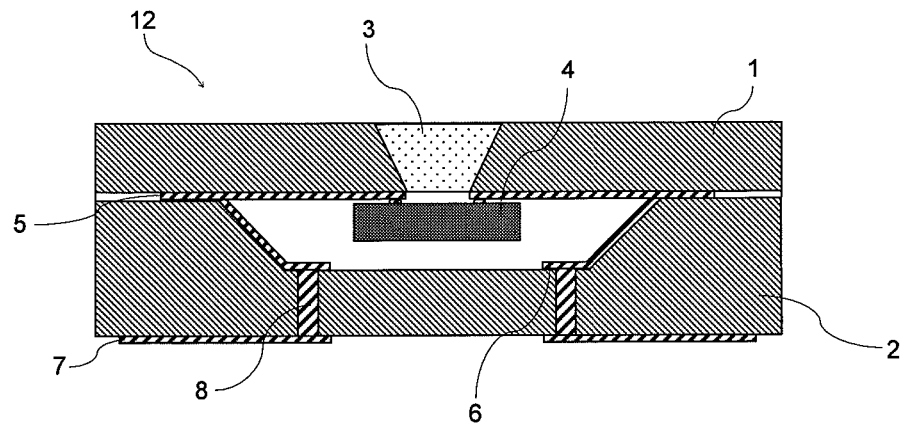
FIG. 1 is a cross-sectional view schematically illustrating a structure of an optical sensor device of the present invention.

An optical sensor device of the present invention includes a light shielding glass substrate at least a part of which has a light filter function, a light shielding glass substrate including a cavity, a wiring pattern metallized on the light shielding glass substrate, and an optical sensor element mounted on the light shielding glass substrate and electrically connected to the wiring pattern, and the optical sensor element is fixed so as to be surrounded by the light shielding glass substrate having the filter function and the light shielding glass substrate including the cavity. FIG. 1 schematically illustrates a cross-sectional structure of the optical sensor device of the present invention.

A glass substrate 1 (hereinafter, referred to as glass lid substrate 1) has light shielding property. The glass lid substrate 1 is provided with a through hole. Glass 3 having a filter function is embedded in the through hole. The diameter of the glass 3 on the side facing an optical sensor element 4 is set to be equal to or smaller than the length of one side of the optical sensor element 4. Light can therefore be allowed to effectively enter a light receiving area (not shown) provided on the top surface of the optical sensor element.

A glass substrate 2 has light shielding property and is shaped to have a cavity. In the structure of the glass substrate 2 after being fitted to the glass lid substrate 1, the glass substrate 2 is disposed so as to surround the side surfaces and the bottom surface of the optical sensor element 4. Accordingly, light entering the optical sensor element from the side surface and from an obliquely upward direction can all be shielded.

Figure 2:
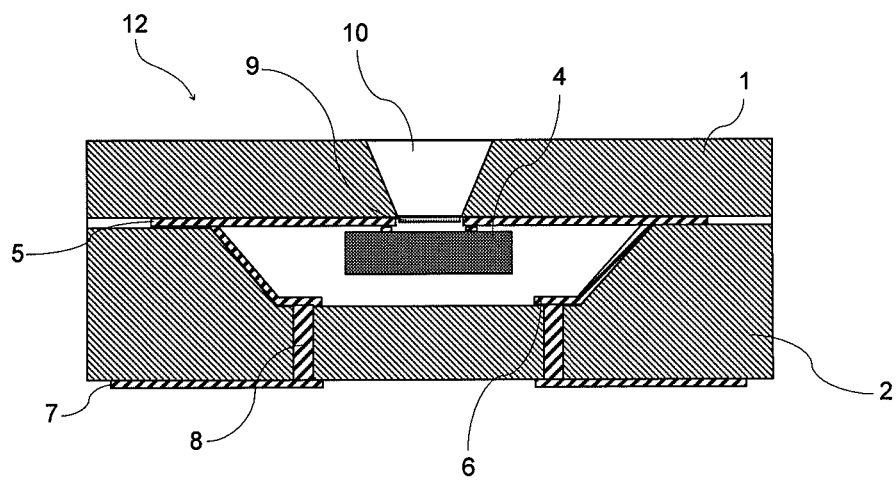
FIG. 2 is a cross-sectional view schematically illustrating another structure of the optical sensor device of the present invention.

Alternatively, the light filter function may be provided as illustrated in FIG. 2 in which transparent glass 10 is used as the glass 3 embedded in the through hole provided in the glass lid substrate 1 and an interference filter made of a metal oxide multilayer film 9 is provided on the surface of the transparent glass exposed on the same surface side as a mounting surface of the optical sensor element 4.

Figure 3:
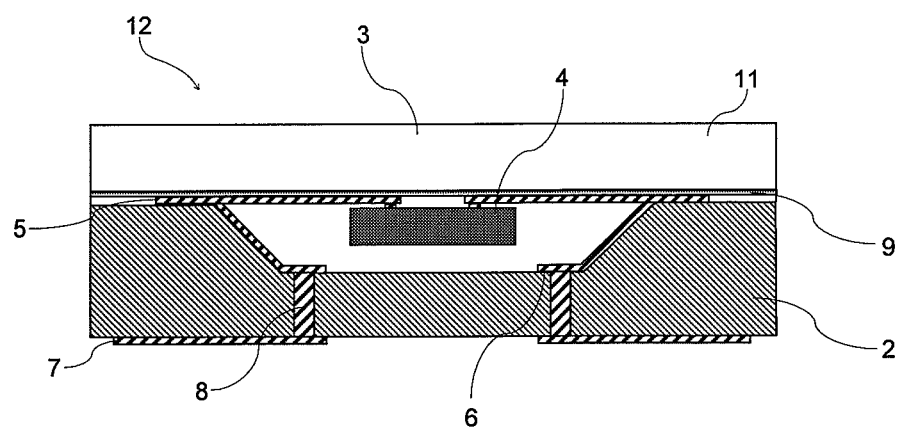
FIG. 3 is a cross-sectional view schematically illustrating still another structure of the optical sensor device of the present invention.

Still alternatively, the light filter function may be provided as illustrated in FIG. 3 in which the glass lid substrate 1 is replaced by a glass substrate 11 made of only transparent glass without any through hole and an interference filter made of the metal oxide multilayer film 9 is provided on the entire surface of the glass substrate 11 on the same side as the mounting surface of the optical sensor element.

(First Embodiment)

Hereinafter, the structure of an optical sensor device according to exemplary embodiments of the present invention is described with reference to the drawings.

FIG. 1 is a schematic view of an optical sensor device 12 of a first embodiment of the present invention. FIG. 1 is a vertical cross-sectional view of the optical sensor device. A light shielding glass lid substrate 1, in which glass having a filter function is embedded in part, has an optical sensor element 4 mounted thereon and is integrated with a light shielding glass substrate 2 that has a cavity. Light shielding glass is used as the glass lid substrate 1. The glass lid substrate 1 has a plate shape and is provided with a through hole, into which glass 3 having a light filter function is embedded. The through hole and the glass 3 having the filter function have a frustum shape so that external light may effectively and efficiently enter the optical sensor element 4 and so as not to be easily detached from the glass lid substrate 1. The glass lid substrate 1 has a wiring pattern formed thereon by metallization. The optical sensor element 4 is mounted on the central axis of the glass 3 having the light filter function embedded in the through hole of the glass lid substrate 1, and is electrically connected to the wiring pattern. The optical sensor element 4 is mounted on and electrically connected to a first wiring pattern 5 by flip-chip bonding, the wiring pattern 5 being provided on the glass lid substrate 1 by metallization. This enables the optical sensor element 4 to be mounted in proximity to the glass lid substrate 1, and hence light entering the glass 3 having the filter function is allowed to pass through the glass 3 to enter the optical sensor element 4 without attenuation. The front surface of the glass lid substrate 1 and the front surface of the glass substrate 2 shield light emitted outside. The glass 3, however, has the function of transmitting visible light from which infrared light has been absorbed. The optical sensor element 4 can therefore serve as an optical sensor corresponding to the visibility. The glass substrate 2 is provided with a through electrode 8 at the bottom of the cavity. The through electrode 8 electrically connects a second wiring pattern 6, which is formed by metallization from an upper end surface of the cavity to a bottom surface over an inclined surface thereof, and a third wiring pattern 7, which is formed by metallization on the rear surface of the substrate opposite to the cavity. The wiring pattern 5, onto which the optical sensor element 4 is mounted and to which the optical sensor element 4 is electrically connected, is electrically connected to the wiring pattern 6. Accordingly, an electromotive force generated by the optical sensor element 4 can be transferred to the outside via the wiring patterns.

The glass having the filter function as used herein is glass which works to absorb infrared light by its own property, and phosphate-based compositions are typically used. The light shielding glass as used herein is glass which works to shield light by its own property and has a pigment added therein to have a light shielding function. As the pigment, a metal oxide such as ferric oxide is typically used. Accordingly, there is no restriction on the selection of glass, and glass can be selected from various kinds of glass, including inexpensive soda glass.

Further, the optical sensor element 4 surrounded by the glass lid substrate 1 and the glass substrate 2 including the cavity can be hermetically sealed to be in a hollow state. As a result, the optical sensor element 4 is free from stress which is otherwise generated by, for example, a structure sealed by a resin mold, and the reliability can therefore be enhanced.

(Second Embodiment)

FIG. 2 is a cross-sectional view of an optical sensor device 12 according to a second embodiment of the present invention. The optical sensor device 12 of this embodiment has the same structure as in the first embodiment except that glass 10 embedded in the through hole provided in the glass lid substrate 1 is transparent glass having no filter function. In the glass lid substrate 1, a metal oxide multilayer film 9 is formed on the front surface of the transparent glass 10 which is exposed on the surface on which the optical sensor element 4 is mounted. This produces an equivalent effect to that obtained by the glass lid substrate 1 in which the glass 3 having the filter function is embedded.

(Third Embodiment)

FIG. 3 is a cross-sectional view of an optical sensor device 12 according to a third embodiment of the present invention. In the third embodiment, the glass lid substrate 1 is replaced by a glass substrate 11 made of only transparent glass without any through hole, and the metal oxide multilayer film 9 is formed on the entire surface of the glass substrate 11 on the optical sensor element mounting surface side. With this, external light that may pass through the substrate 11 to enter the optical sensor element 4 is limited to visible light from which infrared light has been absorbed. The optical sensor element 4 can therefore serve as an optical sensor corresponding to the visibility.

(Fourth Embodiment)

Figure 4A:
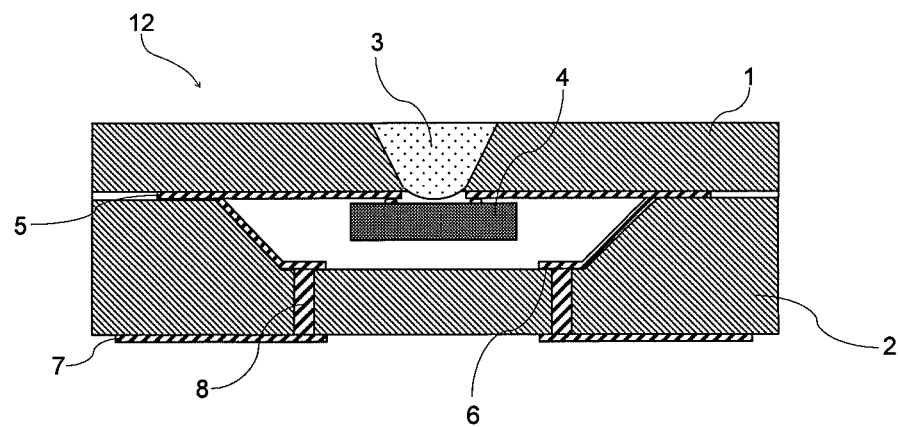
FIGS. 4A and 4B are cross-sectional views schematically illustrating yet another structure of the optical sensor device of the present invention.
Figure 4B:
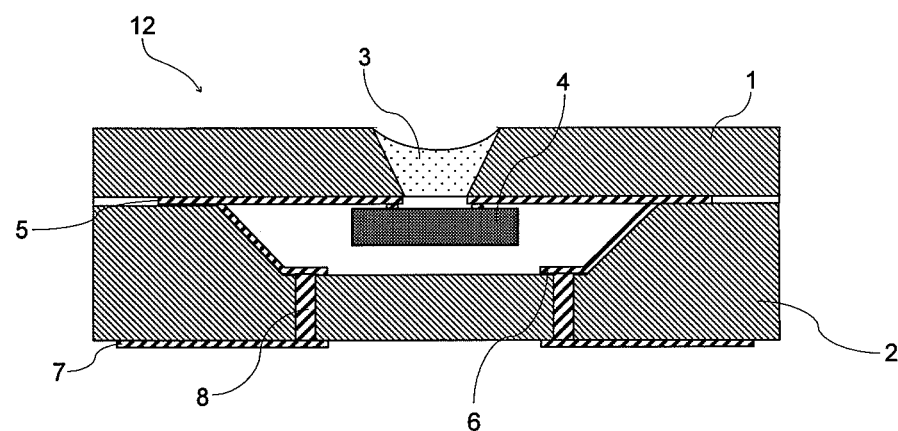

FIGS. 4A and 4B are cross-sectional views of an optical sensor device 12 according to a fourth embodiment of the present invention. Note that, description on parts having the same structure as in the first embodiment is omitted. As illustrated in FIGS. 4A and 4B, this embodiment has a feature in the shape of glass 3 having a filter function, which is embedded in the glass lid substrate 1 made of light shielding glass. In FIG. 4A, the filter glass 3 embedded in the through hole of the glass lid substrate 1 has a convex lens shape which is exposed on the glass lid substrate 1 from the surface side on which the optical sensor element 4 is mounted. With this, light having passed through the glass 3 from the outside can be allowed to effectively enter a light receiving area (not shown)

provided on the top surface of the optical sensor element 4. Further, owing to the convex lens shape, the distance between the glass 3 and the optical sensor element 4 is reduced, and the light can be condensed at the distal end of the lens. The optical sensor element 4 can therefore serve as a high sensitive optical sensor even with a small amount of light. In FIG. 4B, the glass 3 exposed on the surface of the glass lid substrate 1 on which the optical sensor element 4 is not mounted has a concave lens shape at its distal end. Also in this case, a similar effect to that in FIG. 4A can be obtained.

According to the present invention, an optical sensor device having high reliability because an element is surrounded by glass and serving as an optical sensor supporting visible light can be provided simply at low cost. The present invention can therefore contribute to the supply of various devices equipped with an optical sensor device, such as mobile terminals and lighting fixtures, which cover the indoor and outdoor applications and the use under a severe environment.

What is claimed is:

1. An optical sensor device, comprising:
   a light shielding glass substrate having a cavity in a surface thereof;
   a glass lid substrate disposed on and adhered to the light shielding glass substrate to cover the cavity, a part of the glass lid substrate having a light filter function;
   a first wiring pattern formed on a surface of the glass lid substrate that faces the cavity;
   an optical sensor element disposed in the cavity and electrically connected to the first wiring pattern;
   a second wiring pattern formed on the light shielding glass substrate and extending along the cavity surface from an upper end surface of the cavity, where the second wiring pattern is electrically connected to the first wiring pattern, to a bottom surface of the cavity;
   a third wiring pattern formed on a surface of the light shielding glass substrate that is opposite to the surface having the cavity; and
   a through electrode extending through the light shielding glass substrate and electrically connected at one end thereof to the second wiring pattern at the bottom surface of the cavity and at another end thereof to the third wiring pattern.

2. An optical sensor device according to claim 1, wherein the part of the glass lid substrate having a light filter function comprises glass having a light filter function.

3. An optical sensor device according to claim 2, wherein the part of the glass having the light filter function comprises glass having a function of filtering out a specific wavelength of light by its own property.

4. An optical sensor device according to claim 2, wherein the light shielding glass substrate comprises glass having a light shielding property as its own property.

5. An optical sensor device according to claim 2, wherein the part of the glass having the light filter function has a frustum shape, in which a side facing outside is wider and a side facing the optical sensor element is narrower.

6. An optical sensor device according to claim 2, wherein the part of the glass having the light filter function includes a metal oxide multilayer film formed on transparent glass.

7. An optical sensor device according to claim 5, wherein the part of the glass having the light filter function and having the frustum shape has a diameter on the side facing the optical sensor element which is equal to or smaller than a length of one side of the optical sensor element, and a diameter on the side facing outside which is larger than the length of the one side of the optical sensor element.

8. An optical sensor device according to claim 2, wherein the glass lid substrate and the light shielding glass substrate are adhered to each other so as to surround the optical sensor element.

9. An optical sensor device according to claim 2, wherein a shape of the glass having the light filter function, which is exposed on a surface on which the optical sensor element is mounted, comprises a convex hemispherical lens shape.

10. An optical sensor device according to claim 2, wherein a shape of the glass having the light filter function, which corresponds to a surface on which the optical sensor element is not mounted, comprises a hemispherical shape recessed from a flat surface of the glass lid substrate.

11. An optical sensor device according to claim 1, wherein the light shielding glass substrate comprises glass having a light shielding property as its own property.

12. An optical sensor device according claim 1, wherein the glass lid substrate and the light shielding glass substrate are adhered to each other so as to surround the optical sensor element.

13. An optical sensor device according to claim 1; wherein the first, second and third wiring patterns comprise metallized wiring patterns.

14. An optical sensor device according to claim 1; wherein the glass lid substrate has a plate shape having an inner surface that faces the light shielding glass substrate and an outer surface that faces away the light shielding glass substrate, and the part of the glass lid substrate having the light filter function does not extend beyond the outer surface.

15. An optical sensor device according to claim 1; wherein the glass lid substrate has a through hole located directly over the optical sensor element, and the part of the glass lid substrate having a light filter function comprises glass having a light filter function disposed in the through hole.

16. An optical sensor device according to claim 15; wherein the glass having a light filter function has a convex lens shape on the side thereof facing the optical sensor element.

17. An optical sensor device according to claim 15; wherein the glass having a light filter function has a concave lens shape on the side thereof facing away from the optical sensor element.

18. An optical sensor device according to claim 1; wherein the glass lid substrate has a through hole located directly over the optical sensor element, and the part of the glass lid substrate having a light filter function comprises a metal oxide multilayer film formed on a transparent glass disposed in the through hole.

19. An optical sensor device according to claim 1; wherein the glass lid substrate is comprised of transparent glass, and the part of the glass lid substrate having a light filter function comprises a metal oxide multilayer formed on the surface of the glass lid substrate that faces the cavity.

20. An optical sensor device according to claim 1; comprising a plurality of through electrodes extending through the light shielding glass substrate each electrically connected at one end thereof to the second wiring pattern at the bottom surface of the cavity and at another end thereof to the third wiring pattern.

* * * * *